(12) United States Patent  
Degani et al.

(10) Patent No.: US 7,355,264 B2
(45) Date of Patent: Apr. 8, 2008

(54) INTEGRATED PASSIVE DEVICES WITH HIGH Q INDUCTORS

(75) Inventors: Yinon Degani, Highland Park, NJ (US); Yinchao Chen, Columbia, SC (US); Yu Fan, Dallas, TX (US); Charley Chunlei Gao, Plano, TX (US); Kunquan Sun, Plano, TX (US); Liquo Sun, Plano, TX (US)

(73) Assignee: Sychip Inc., Plano, TX (US)

( * ) Notice: Subject to any disclaimer, the term of this patent is extended or adjusted under 35 U.S.C. 154(b) by 0 days.

(21) Appl. No.: 11/520,254

(22) Filed: Sep. 13, 2006

(65) Prior Publication Data

US 2008/0061420 A1    Mar. 13, 2008

(51) Int. Cl.
*H01L 23/48* (2006.01)

(52) U.S. Cl. .............. 257/531; 257/E25.006; 257/E25.027; 257/E25.029; 257/E25.03; 257/E25.031; 257/E25.032; 257/532; 257/535; 257/536; 257/723; 257/724; 257/725; 257/728; 257/528; 257/685; 257/686; 257/777

(58) Field of Classification Search ........ 257/E25.006, 257/E25.027, E25.029, E25.03, E25.031, 257/E25.032, 528, 536, 723–725, 728, 685, 257/686, 777, 778, 734, 737, 738
See application file for complete search history.

(56) References Cited

U.S. PATENT DOCUMENTS

| | | | | |
|---|---|---|---|---|
| 7,183,622 | B2 * | 2/2007 | Heck et al. | 257/528 |
| 7,185,542 | B2 * | 3/2007 | Bang et al. | 73/514.29 |
| 7,232,708 | B2 * | 6/2007 | Morkner | 438/109 |
| 2005/0014301 | A1 * | 1/2005 | Hamren et al. | 438/18 |
| 2005/0168306 | A1 * | 8/2005 | Cohn et al. | 335/78 |
| 2005/0287785 | A1 * | 12/2005 | Lee | 438/613 |
| 2006/0022290 | A1 * | 2/2006 | Chen et al. | 257/432 |
| 2007/0102733 | A1 * | 5/2007 | Zhou et al. | 257/248 |

* cited by examiner

*Primary Examiner*—Alexander Oscar Williams
(74) *Attorney, Agent, or Firm*—Peter V. D. Wilde

(57) ABSTRACT

The specification describes flip bonded dual substrate inductors wherein a portion of the inductor is constructed on a base IPD substrate, a mating portion of the inductor is constructed on a cover (second) substrate. The cover substrate is then flip bonded to the base substrate, thus mating the two portions of the inductor. Using this approach, a two level inductor can be constructed without using a multilevel substrate. Using two two-level substrates yields a four-level flip bonded dual substrate inductor.

21 Claims, 5 Drawing Sheets

INTEGRATED PASSIVE DEVICES WITH HIGH Q INDUCTORS

FIELD OF THE INVENTION

This invention relates to integrated passive devices (IPDs) and more specifically to improved integrated inductors.

BACKGROUND OF THE INVENTION (Portions of the technical material contained in this section may not be prior art.)

State of the art radio-frequency (RF) electrical circuits use large quantities of inductors. Many of these circuits are used in hand held wireless products. Accordingly, miniaturization of passive devices and passive device circuits is an important goal in RF device technology.

Recent advances in passive device technology have produced integrated passive devices (IPDs) wherein inductors, capacitors, and resistors are integrated on a single compact substrate. IPD substrates are large, and preferably made of silicon, but in some cases ceramic. More details on IPD structures and their manufacture can be found in U.S. application Ser. No. 11/030,754, filed Jan. 6, 2005, which is incorporated herein by reference.

Design of inductor components in these IPDs usually has two goals, high Q and a compact space. In general, inductor devices require conductors that run side-by-side along a substantial length. The RF current flows in the same direction through the side-by-side conductors so that the magnetic flux lines are in the same phase. This results in a large mutual inductance. Straight conductors, that is, elongated pairs of runners, achieve this goal in principle but consume excessive linear space in a conventional IPD. Spiral shaped runners, and nested squares or rectangles of runners, achieve the desired result in a more compact space.

The other goal, high Q, seeks high performance (inductance value) with low power loss. Several factors influence the Q factor. The inductance value depends (inter alia) on the length and spacing of the runners. The power loss depends to first order on the conductivity of the metal. The conductivity is dependent on the width and thickness of the runners. Thus several parameters enter the design considerations for high Q inductors.

In state of the art integrated passive devices some of the design goals are in conflict. For example, for small, compact, IPDs it is desirable to shrink the interconnections. This increases the resistance of the inductor runners and reduces the Q of the inductor. To offset this, the conductivity of the runner may be increased by switching from aluminum, the standard metal, to copper. Another proposal is to coat the aluminum runners with a copper strike layer.

Yet another approach is to increase the length of the inductor. Nominally it would appear that increases in inductor length require increased surface area. However, it has been recognized that inductor design is not restricted to two dimensions. Accordingly, three-dimensional IPD devices, i.e. devices built on multiple levels, have been developed. Multiple level inductors produce multiplied inductor values for a given surface area. For example, see Yin et al., Double-Level Spiral Inductors With Multiple Via Interconnects on GaAs Substrates, IEEE TRANSACTIONS ON MAGNETICS, VOL. 40, NO. 3, MAY 2004. This paper describes various structural parameters of stacked, multilevel inductors, and is incorporated herein by reference.

With the proven value of two-level inductors, additional levels, for example, four levels, would appear to be the next step. However, each added multiple level in an IPD substrate increases cost. This is especially the case where the multiple levels serve only the inductor elements.

More efficient designs for three-dimensional IPDs would allow continued progress in IPD technology.

SUMMARY OF THE INVENTION

We have developed a new approach to constructing three-dimensional inductors for IPD devices. It involves constructing a portion of the inductor on a base (first) IPD substrate, and constructing a mating portion of the inductor on a cover (second) substrate. The cover substrate is then flip bonded to the base substrate, thus mating the two portions of the inductor. Using this approach, a two level inductor can be constructed without using a multilevel substrate. Using two two-level substrates yields a four-level device.

A consequence of this new approach is that the structure allows different substrates to be used in the two portions. Thus a silicon IPD substrate may be used for the first portion of the inductor, and a GaAs substrate, for example, may be used for the second portion of the inductor. Other components may be built on the substrates according to the demands needed, i.e. high performance components may be added on the GaAs substrate, and less demanding components located on the silicon substrate.

The inductor construction of the invention, wherein two substrates each comprising a portion of the inductor body are bonded together using techniques familiar in flip-chip assembly, are referred to as flip bonded dual substrate inductors.

DETAILED DESCRIPTION

Figure 1:
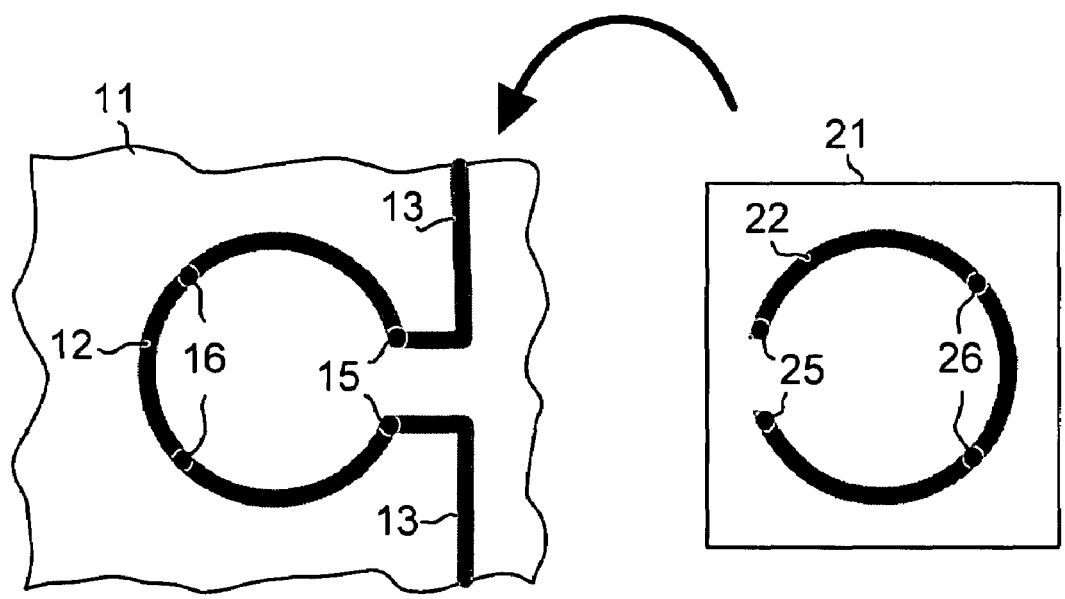
FIG. 1 is a plan schematic view of two substrates comprising two inductor halves prior to flip bonding.

FIG. 1 is a top view of the base substrate 11 and the cover substrate 21, each carrying half of the inductor structure. In the embodiment shown, the inductor body, comprising elements 12 and 22, is in the pattern of an arc greater than 270 degrees. The inductor body comprises a metal conductor, typically aluminum, copper, or other suitable conductive material. Interconnection runners to the inductor body 12 on the base substrate are shown at 13. Mating interconnections connecting the two halves of the inductor body are shown at 15 and 25. Intermediate interconnections, which are optional, are shown at 16 and 26. The use of intermediate interconnections in a stacked multilevel inductor is discussed in Yin et al., referenced earlier. The two substrates are shown in an elevation view in FIG. 2.

Substrate 11 is illustrated as a portion of a larger substrate. Typically one or both the base substrate and the cover substrate will have additional circuitry on the substrate. The additional circuitry may comprise other IPD elements such as capacitors and resistors, as well as active device such as transistors.

An important aspect of the invention resides in the fact that forming the inductor in the manner shown allows one inductor half (or portion) to be formed on a substrate of one material, for example, silicon, while the other half of the inductor is formed on a substrate of a different material, for example GaAs. Either substrate, or both substrates, may be formed of other materials, e.g. ceramic. However, as pointed out in the patent application referenced above, a preferred substrate material is silicon. More recent work shows the advantages of GaAs as an inductor substrate material. See for example, I. J. Bahl, "High current handling capacity multilayer inductors for RF and microwave circuits", Int. J. RF Microwave Computer-Aided Eng., vol. 10, pp. 139-146, 2000. The use of mixed materials as substrates adds another dimension to the circuit design. High Q components may be selectively formed on a GaAs substrate, while less demanding elements may be formed on a silicon substrate. Using different properties of the substrates provides a variety of useful circuit design options.

Figure 2:
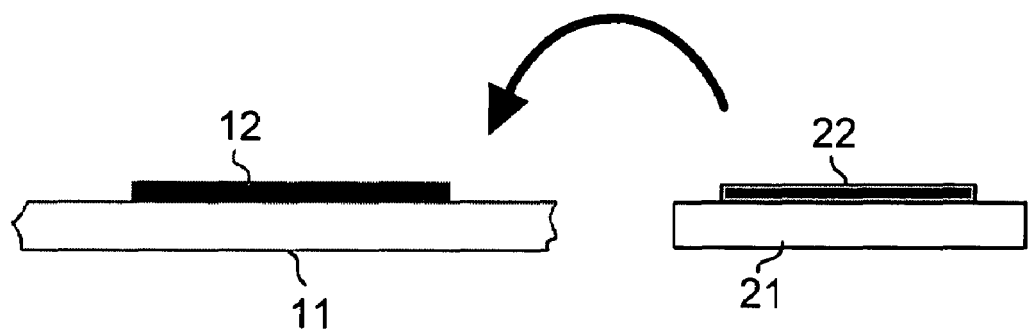
FIG. 2 is an elevation view of the two substrates of FIG. 1.

The geometric pattern of the inductor in FIGS. 1 and 2 is an arc of a circle, in this case an arc greater than 270 degrees. As pointed out above, straight metal runners may be used for stacked inductors, but to increase the conductor length in an area-efficient manner, the runners are typically formed in geometric configurations. Spiral configurations are common. In stacked multilevel inductors, square or rectangular configurations have been used (see Yin et al., supra). A large variety of meandering configurations have been proposed for inductor bodies. Any of these may be used in implementing the invention described here. The term geometric configuration is defined here as a two-dimensional shape having at least one curve or corner.

FIGS. 3-7 show steps useful in the fabrication of the flip bonded dual substrate inductors of the invention. A finished inductor is shown in FIG. 8.

Figure 3:
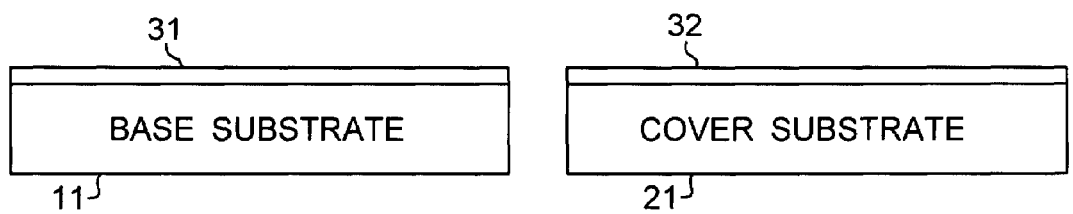
FIGS. 3-8 illustrate steps in the fabrication of a flip bonded dual substrate inductor according to the invention.

Referring to FIG. 3, the mating substrates 11, 21 are coated with insulating layers 31, 32, for example $SiO_2$, by growing or blanket depositing the oxide on the substrate surface. Typically the same oxide will be used on both substrates. However, if the substrates are of different materials, different insulating materials on the respective substrates may be beneficial.

Figure 4:
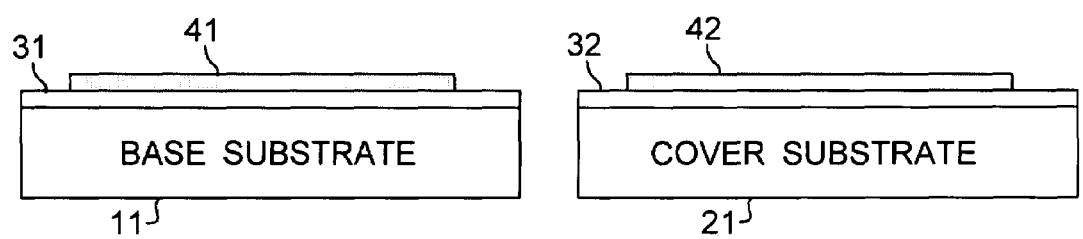

In FIG. 4, patterned layers of metal, 41, 42, are formed on the substrates. The materials and pattern designs are discussed above. The metal layers may be deposited by any suitable process. A preferred method is to blanket deposit the metal layer, then mask the layer with a mask, e.g. a photolithographic mask, in the pattern desired, and etch away the exposed portions. This leaves a portion of the inductor body 41 on the base substrate, and a portion of the inductor body 42 on the cover substrate. The portions of the inductor are intended as mating halves, to be joined by flipping the cover substrate over the base substrate (or vice versa). Accordingly inductor body portion 41 and inductor body portion 42 are mirror images of one another.

The preferred flip bonded dual substrate inductor structure is one where the inductor body on the cover substrate is a complete mirror image of the inductor body on the base substrate. This is essentially the configuration shown in the figures. It is effective because the upper and lower runners have coupling fields along their entire length. However, those skilled in the art will recognize that partial coupling will also achieve useful and desirable results. This means that the patterns in each of the inductor body portions do not have to be completely congruent. However, they are preferably at least partially congruent. To realize the goals of the invention it is sufficient if at least 30%, preferably 50%, and ideally 100% of one of the inductor body portions is congruent with the inductor body portion on the mating substrate. At least partial congruence between geometric configurations is defined as a relationship where an area of one geometric configuration directly overlies an area of another geometric configuration when viewed from above. This prescription allows incomplete congruence not only along the length of the inductor body, but also along the thickness dimension. Thus the runner in one inductor body portion may be wider than the runner in the other inductor body portion. Accordingly, the congruence factor is an area congruence factor. At least 30% of the area of one inductor body portion should directly overlie a corresponding area of the other inductor body portion.

In those cases where there is partial congruence the geometric configuration of one inductor body portion will be at least a partial mirror image of the geometric configuration of the mating inductor body portion.

Figure 5:
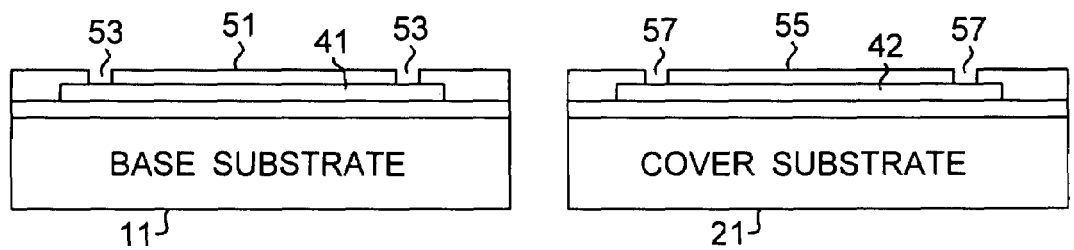

In FIG. 5, dielectric layers, for example $SiO_2$ layers, 51 and 55 are formed over the metal inductor bodies 41 and 42, and contact windows 53 and 57 are formed through layers 51 and 55, exposing the metal layers 41 and 42 for electrical contacts. Windows 53 are aligned with windows 57, so that metal pattern 41 and contact windows 53 form a mirror image of metal pattern 42, and contact windows 57. Widely known techniques may be used for forming the windows. Also, any of a variety of suitable materials may be chosen for the dielectric layers. If the inductor design or other IPD compatible steps call for thin dielectric layers, for example if this layer is also used at another location on the IPD for a capacitor dielectric, the layer may be $SiO_2$ with a thickness of less than 0.1 micron, or less than 0.5 micron. Thicker $SiO_2$ layers, e.g. 0.5-5 microns, may also be used. If an organic dielectric is used, for example polyimide, the layer thickness is usually greater, e.g. 1-10 microns.

Figure 6:
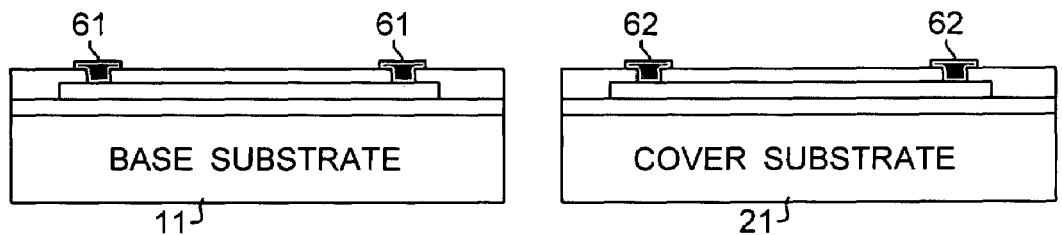

In FIG. 6, electrical contacts 61 and 62 are formed in and on the contact windows as shown. These comprise solder bump contacts, and may include under bump metallization. The nature of the contacts depends on the material of the inductor body. If the inductor body is copper, and the contacts 61 and 62 are copper, the solder bumps may bond directly to the copper contacts. However, if the contacts are aluminum, a special UBM is typically used. The usual practice in the industry is to apply a UBM coating to the aluminum contact pads, and apply the solder bump or pad to the coating. The metal or metals used in UBM technology must adhere well to aluminum, be wettable by typical tin solder formulations, and be highly conductive. A structure meeting these requirements is a composite of chromium and copper. Chromium is deposited first, to adhere to the aluminum, and copper is applied over the chromium to provide a solder wettable surface. UBM layers are conventionally sputtered.

Figure 7:
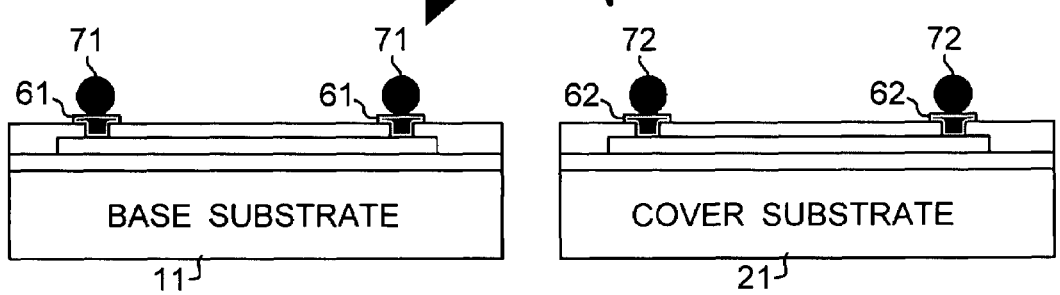
Figure 8:
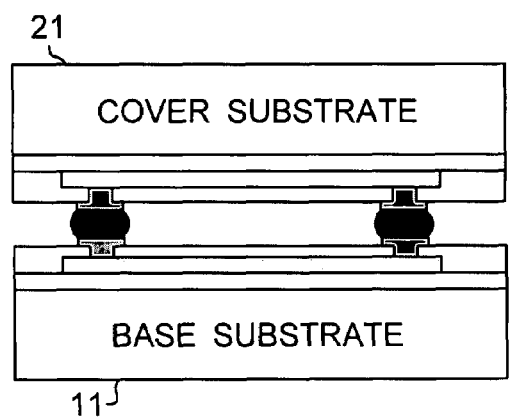

FIG. 7 shows solder bumps 72 applied to UBM 62 on cover substrate 21. Alternatively, solder bumps 71 can be applied to UBM 61 on the base substrate, or, in some cases, to the UBM on both substrates. The solder bumps are typically applied using a solder paste process.

With both the base substrate and the cover substrate essentially completed, the two substrates are assembled together, as shown in FIG. 8, by flip bonding one substrate on top of the other, registering the solder bumps 72 to the UBM on base substrate 11, and reflowing the solder bumps to attach the two substrates together. The result is a two-level flip bonded dual substrate inductor. It will be appreciated that this multi-level inductor is fabricated without using any multi-level substrate.

The combination of the thickness of dielectric layers 51 and 55, the thickness of UBM 61 and 62, and the diameter of solder bumps 71 after reflow, determine the spacing between the two portions 41 and 42 of the inductor body. This spacing is typically not a critical design parameter for inductor performance, and significant latitude is allowed for the geometries of the elements used to flip bond the substrates together. Overall, the spacing between inductor bodies 41 and 42 may be in the range 1-100 microns.

Figure 9:
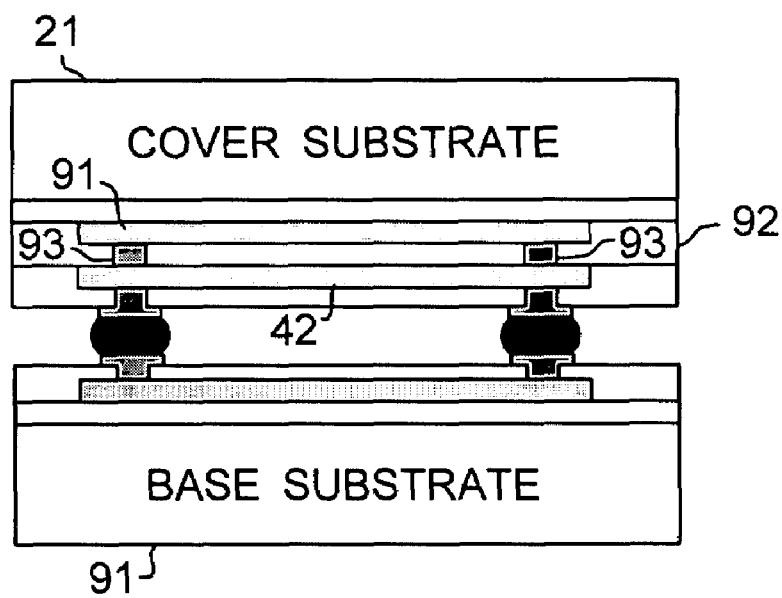
FIGS. 9 and 10 show alternative embodiments of flip bonded dual substrate inductors.

As mentioned earlier, the flip bonded dual substrate inductors may have more than two levels. A wide variety of options are available for designing additional levels and additional inductor lengths using the basic building blocks just described. FIG. 9 shows a three level flip bonded dual substrate inductor. The third level is added to cover substrate 21 in the form of added inductor body 91, added interlevel dielectric 92, and conductor plugs 93 electrically interconnecting inductor bodies 42 and 91. Those skilled in the art will appreciate that the layer elements 91, 92, and 93 are formed after the step shown in FIG. 3, using the same approaches described for FIGS. 4-6.

Figure 10:
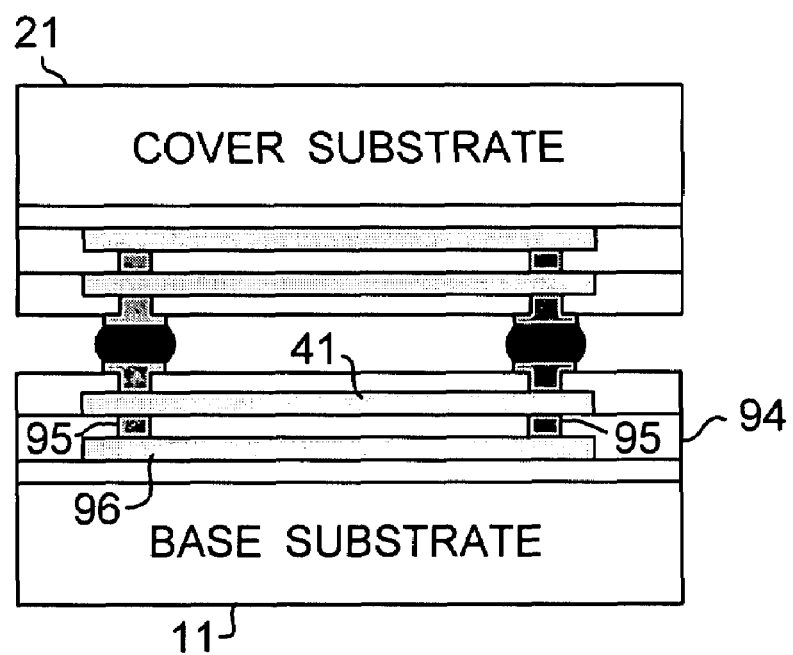

FIG. 10 shows a four-level embodiment, where a level is added to the base substrate. The added inductor body is shown at 96, the added interlevel dielectric is shown at 94, and the conductive plugs connecting the inductor body 96 with inductor body 41 are shown at 95.

Any desired number of levels may be constructed in either the base substrate or the cover substrate. The inductor bodies that reside on the same substrate, for example, 91 and 42 in FIG. 9, or 96 and 41 in FIG. 10, are congruent. After the two substrates are bonded together, all of the inductor bodies are mutually congruent.

As mentioned above, either or both substrates in the flip bonded dual substrate inductor may carry other IPD components. These are typically thin film devices formed by steps compatible with those described above. Thin film techniques for forming these passive elements are well developed and specific thin film processes need not be reiterated here. See for example U.S. Pat. No. 6,075,691, issued Jun. 13, 2000, and U.S. Pat. No. 6,005,197, issued Dec. 21, 1999, both of which are incorporated herein by reference.

As described above the base substrate surface and the cover substrate surface are attached together using solder bumps. However, other conductive means may be found effective in attaching the two substrates together.

When the two substrates are attached together, it is evident that the structure requires that the inductor body on one substrate mates with the mirror image inductor body on the other substrate. "Mating" in this context means that the two inductor bodies are adjacent each other.

While the terms base substrate and cover substrate are used above, these terms should not be construed as limiting. It is evident from the description that the substrates are completely interchangeable.

Reference herein to solder bumps is intended to include a variety of solder attachments and solder attachment techniques, including solder bumps, solder balls, solder microbumps, solder paste methods, BGA methods etc.

Figure 11:
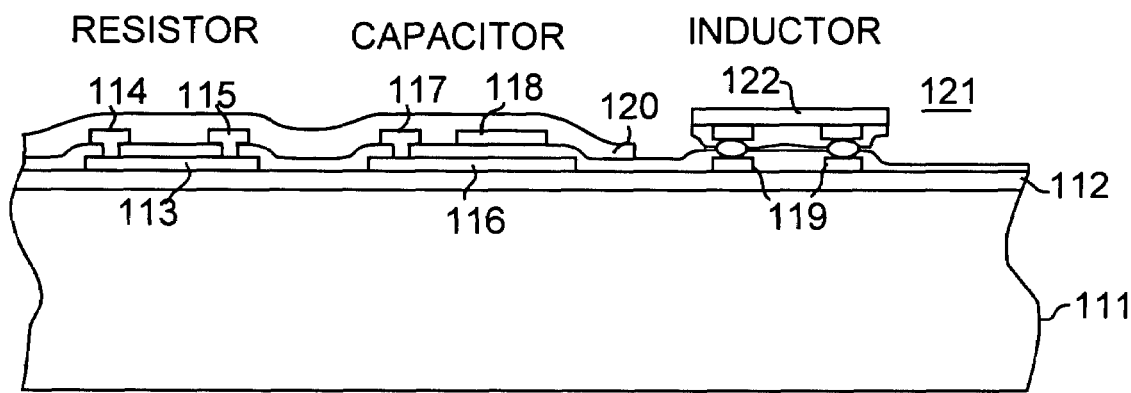
FIG. 11 is a schematic view of an IPD containing an inductor of the invention.

An IPD incorporating a flip bonded dual substrate inductor is illustrated schematically in FIG. 11. Again, the figures are not to scale. This figure is a schematic IPD wherein integrated passive elements or combinations of interconnected passive elements are generically represented. The substrate 111 is provided with grown oxide layer 112. The resistor comprises resistor body 113, and contacts 114 and 115. The capacitor comprises lower capacitor plate 116, upper capacitor plate 118 and lower capacitor plate contact 117. The flip bonded dual substrate inductor 121 comprises metal runners 119. The flip bonded dual substrate inductor 121 comprises a base substrate 11 in this embodiment, and a cover substrate 122.

As mentioned earlier, the concepts described herein apply to either substrate, the base substrate or the cover substrate. This means that, in the context of FIG. 11, either or both the base substrate 11 and the cover substrate 122 may have added inductor elements.

A feature of IPD technology is that elements of more than one component may be formed from the same metal level. For example, resistor contacts 114, 115, and capacitor plate contact 117 may be formed using the same processing steps. Upper capacitor plate 118, and one of the inductor spirals 119 (contacts not shown), may formed using the same steps. The structure is protected with polyimide layer 120.

The thin film passive elements may be formed by a variety of thin film techniques. These techniques are well developed and the specifics need not be reiterated here. See for example U.S. Pat. No. 6,075,691, issued Jun. 13, 2000, and U.S. Pat. No. 6,005,197, issued Dec. 21, 1999. The latter patent describes a multi-layer structure for PCBs, which could easily be adapted for the application described here. A convenient way of defining a thin film passive device is a passive device that is formed on a substrate using one or more layers, typically a plurality of layers, deposited on the substrate. In addition, as mentioned above, one or more elements of two or more components may be formed using the same processing steps.

Figure 12:
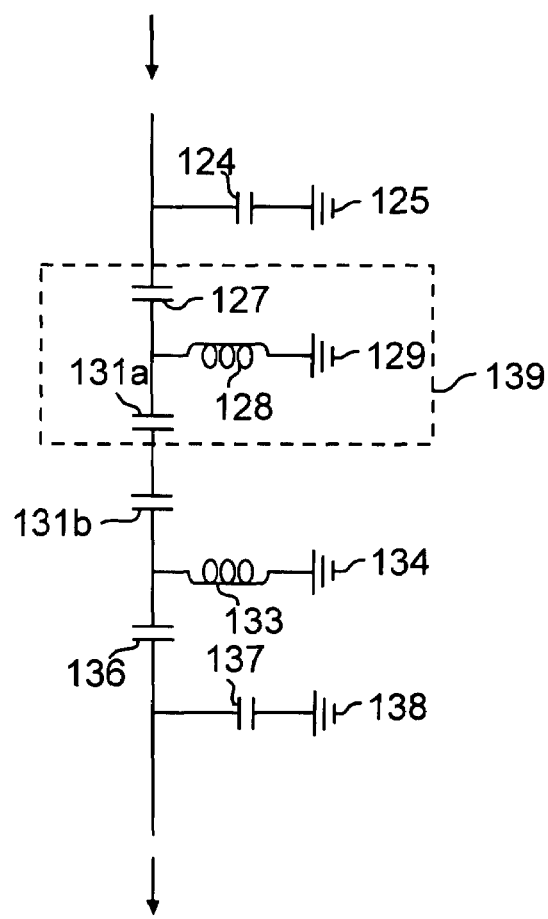
FIG. 12 is an IPD circuit diagram illustrating a typical IPD circuit.

IPD devices have application for mobile transceivers wherein the IPD may function as an RF filter. An example of a typical filter circuit is shown in FIG. 12. The basic building block in this filter circuit is shown in box 139. It comprises capacitors (C) 127 and 131*a*, and flip bonded dual substrate inductor (L) 128 connected to ground at 129. In FIG. 12 there are two repeating units shown, the other LC unit comprising capacitors 136 and 31*b*, and flip bonded dual substrate inductor 133. This LC combination may be used in repeating units to narrow the band pass and increase the out-of-band RF rejection of the filter.

Various additional modifications of this invention will occur to those skilled in the art. All deviations from the specific teachings of this specification that basically rely on the principles and their equivalents through which the art has been advanced are properly considered within the scope of the invention as described and claimed.

The invention claimed is:

1. A method for fabricating a flip bonded dual substrate inductor comprising the steps of:
   a. forming a first inductor body portion on a base substrate surface of a base substrate, the first inductor body portion having a first geometric configuration,
   b. forming a first dielectric layer on the first inductor body portion,
   c. forming a second inductor body portion on a cover substrate surface of a cover substrate, wherein the second inductor body portion on the cover substrate has a geometric configuration that is at least a partial mirror image of the first geometric configuration,
   d. forming a dielectric layer on the second inductor body portion, and
   e. attaching the base substrate surface to the cover substrate surface using an electrically conducting attachment that electrically interconnects the first inductor body portion and the second inductor body portion.

2. The method of claim 1 wherein base substrate is silicon.

3. The method of claim 2 wherein the cover substrate is silicon.

4. The method of claim 2 wherein the cover substrate is GaAs.

5. The method of claim 1 wherein the base substrate and the cover substrate are of different materials.

6. The method of claim 1 wherein the step of attaching the base substrate surface to the cover substrate surface uses solder as an attachment material.

7. The method of claim 6 wherein the step of attaching the base substrate surface to the cover substrate surface comprises applying solder bumps to one or both substrates.

8. The method of claim 1 wherein the geometric configurations comprise an arc or a corner and the geometric configuration on the cover substrate is a mirror image of at least 30% of the geometric configuration on the base substrate.

9. The method of claim 1 further including the step of forming a third inductor body portion on the base substrate, the third inductor body portion having a geometric configuration at least partially congruent with the first inductor body portion.

10. The method of claim 9 further including the step of forming a fourth inductor body portion on the cover substrate, the fourth inductor body portion having a geometric configuration at least partially congruent with the second inductor body portion.

11. A flip bonded dual substrate inductor comprising:
 a. a base substrate,
 b. a first inductor body portion formed on the base substrate surface of a base substrate, the first inductor body portion having a first geometric configuration,
 c. a first dielectric layer formed on the first inductor body portion,
 d. a cover substrate,
 e. a second inductor body portion formed on the cover substrate surface of a cover substrate, wherein the second inductor body portion on the cover substrate has a geometric configuration that is at least a partial mirror image of the first geometric configuration,
 f. a dielectric layer formed on the second inductor body portion,
the flip bonded dual substrate inductor characterized in that the base substrate surface of the base substrate is bonded to the cover substrate surface of the cover substrate with electrically conductive bonds that electrically interconnect the first inductor body portion and the second inductor body portion.

12. The flip bonded dual substrate inductor of claim 11 wherein base substrate is silicon.

13. The flip bonded dual substrate inductor of claim 12 wherein the cover substrate is silicon.

14. The flip bonded dual substrate inductor of claim 12 wherein the cover substrate is GaAs.

15. The flip bonded dual substrate inductor of claim 11 wherein at least 50% of the area of the geometric configuration on the cover substrate directly overlies the geometric configuration on the base substrate.

16. The flip bonded dual substrate inductor of claim 11 wherein the base substrate and the cover substrate are of different materials.

17. The flip bonded dual substrate inductor of claim 11 wherein the electrically conductive bonds comprise solder bumps.

18. The flip bonded dual substrate inductor of claim 11 wherein the geometric configurations comprise an arc or a corner and the geometric configuration on the cover substrate is a mirror image of at least 30% of the geometric configuration on the base substrate.

19. The flip bonded dual substrate inductor of claim 11 further including a third inductor body portion formed on the base substrate, the third inductor body portion having a geometric configuration congruent with the first inductor body portion.

20. The flip bonded dual substrate inductor of claim 19 further including a fourth inductor body portion on the cover substrate, the fourth inductor body portion having a geometric configuration congruent with the second inductor body portion.

21. An Integrated Passive Device (IPD) comprising a base substrate, at least one thin film capacitor on the substrate, and plurality of flip bonded dual substrate inductors on the substrate, the flip bonded dual substrate inductors comprising:
 a. a first inductor body portion formed on the base substrate surface of a base substrate, the first inductor body portion having a first geometric configuration,
 b. a first dielectric layer formed on the first inductor body portion,
 c. a cover substrate,
 d. a second inductor body portion formed on the cover substrate surface of a cover substrate, wherein the second inductor body portion on the cover substrate has a geometric configuration that is at least a partial mirror image of the first geometric configuration,
 e. a dielectric layer formed on the second inductor body portion, the flip bonded dual substrate inductor characterized in that the base substrate surface of the base substrate is bonded to the cover substrate surface of the cover substrate with electrically conductive bonds that electrically interconnect the first inductor body portion and the second inductor body portion.

* * * * *